(12) United States Patent
Liang et al.

(10) Patent No.: US 9,742,434 B1
(45) Date of Patent: Aug. 22, 2017

(54) DATA COMPRESSION AND DE-COMPRESSION METHOD AND DATA COMPRESSOR AND DATA DE-COMPRESSOR

(71) Applicant: MEDIATEK INC., Hsin-Chu (TW)

(72) Inventors: Chih-Chuan Liang, Hsinchu (TW); Jen-Hao Yeh, Hsinchu (TW); Ming-Yang Chao, Zhudong Township, Hsinchu County (TW); Yao-Jen Liu, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/389,682

(22) Filed: Dec. 23, 2016

(51) Int. Cl.
  *H03M 7/30* (2006.01)
  *H04L 5/00* (2006.01)

(52) U.S. Cl.
  CPC ............ *H03M 7/30* (2013.01); *H04L 5/0007* (2013.01)

(58) Field of Classification Search
  USPC .................................................... 341/76, 77
  See application file for complete search history.

(56) References Cited

U.S. PATENT DOCUMENTS

| | | | |
|---|---|---|---|
| 4,558,302 A | 12/1985 | Welch | |
| 4,646,148 A * | 2/1987 | Lienard | H03M 7/30 358/1.9 |
| 5,838,266 A * | 11/1998 | Houle | H03M 7/42 341/106 |
| 5,973,629 A * | 10/1999 | Fujii | G10L 19/04 341/143 |
| 6,366,881 B1 * | 4/2002 | Inoue | G10L 19/04 704/219 |
| 8,842,724 B1 | 9/2014 | Joung et al. | |

FOREIGN PATENT DOCUMENTS

WO    WO 2014/110730    7/2014

\* cited by examiner

*Primary Examiner* — Howard Williams
(74) *Attorney, Agent, or Firm* — McClure, Qualey & Rodack, LLP (57) ABSTRACT

Data compression/decompression methods and data compressor/de-compressor are provided. The data compression method includes the steps of scaling an input signal to generate a scaled signal; transmitting the scaled signal to a differentiator and an assembler; differentiating the scaled signal and a prior signal to generate a differentiation signal detecting zero bits of the differentiation signal to generate a zero range control signal and a zero range control word; refining the differentiation signal according to the zero range control signal to generate a refined signal; and determining to combine the zero range control word with the scaled signal or combine the zero range control word with the refined signal according to the zero range control word to generate a compressed signal.

19 Claims, 6 Drawing Sheets

FIG. 6

DATA COMPRESSION AND DE-COMPRESSION METHOD AND DATA COMPRESSOR AND DATA DE-COMPRESSOR

BACKGROUND OF THE INVENTION

Field of the Invention

The invention generally relates to a compression and de-compression technology, and more particularly, to a method of compressing an input signal according to a zero range control word which is generated by converting or compressing the zero bits of the input signal.

Description of the Related Art

Wireless communication systems are widely employed to provide various telecommunication services such as telephony, video, data, messaging, and broadcast. Typical wireless communication systems may employ multiple-access technologies capable of supporting communication with multiple users by sharing available system resources (e.g., bandwidth, transmission power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

However, in an OFDM system, the data throughput of wide bandwidth and complex modulation scheme OFDM signal is so high that the current bus mechanism can't transmit all the data in a single bus. In addition, because the Peak to Average Power Ratio (PAPR) value of the OFDM signal is not small, the OFDM signal needs to add extra bits for extending the signal dynamic rage. However, the extra bits are zero bits in many situations, i.e. the data size of the input OFDM signal becomes lager because of the zero bits of the input OFDM signal.

Therefore, avoiding above problem to facilitate decreasing the data size of the input OFDM signal and decreasing the throughput of the data transmission is a subject worthy of discussion.

BRIEF SUMMARY OF THE INVENTION

The methods and devices for data compression and data de-compression are provided to overcome the problems mentioned above.

An embodiment of the invention provides a data compression method. The data compression method comprises the steps of scaling an input signal to generate a scaled signal; transmitting the scaled signal to a differentiator and an assembler; differentiating the scaled signal and a prior signal to generate a differentiation signal detecting zero bits of the differentiation signal to generate a zero range control signal and a zero range control word; refining the differentiation signal according to the zero range control signal to generate a refined signal; and determining to combine the zero range control word with the scaled signal or combine the zero range control word with the refined signal according to the zero range control word to generate a compressed signal.

An embodiment of the invention provides a data de-compression method. The data de-compression method comprises the steps of de-assembling a compressed signal to generate a zero range control word and a refined signal; extending zero bits to the refined signal to generate a first extending signal according to the zero range control word; and selecting the first extending signal or a second extending signal as a decompressed signal according to the zero range control word, wherein the second extending signal is generated according to the first extending signal. The data de-compression method further comprises the step of accumulating the first extending signal with a prior signal to generate the second extending signal.

An embodiment of the invention provides a data compressor. The data compressor comprises a scaler, a differentiator, a calculator and an assembler. The scaler is configured to scale an input signal to generate a scaled signal. The differentiator is configured to receive the scaled signal from the scaler and differentiate the scaled signal and a prior signal stored in a memory buffer to generate a differentiation signal. The calculator is configured to detect zero bits of the differentiation signal to generate a zero range control signal and a zero range control word and refine the differentiation signal according to the zero range control signal to generate a refined signal. The assembler is configured to determine to combine the zero range control word with the scaled signal or combine the zero range control word with the refined signal according to the zero range control word to generate a compressed signal.

In the embodiment of the invention, the calculator comprises a detecting module and a refine module. The detecting module, configured to detect zero bits of the differentiation signal. The refine module, configured to refine the differentiation signal according to the zero range control signal.

An embodiment of the invention provides a data de-compressor. The data de-compressor comprises a de-assembler, an extending unit, and a selector. The de-assembler is configured to de-assemble a compressed signal to generate a zero range control word and a refined signal. The extending unit is configured to receive the zero range control word and the refined signal from the de-assembler and extend zero bits to the refined signal to generate a first extending signal according to the zero range control word. The selector is configured to select the first extending signal or a second extending signal as a decompressed signal according to the zero range control word, wherein the second extending signal is generated according to the first extending signal.

In the embodiment of the invention, the data de-compressor further comprises an accumulator. The accumulator is configured to accumulate the first extending signal with a prior signal stored in a memory buffer to generate the second extending signal.

Other aspects and features of the invention will become apparent to those with ordinary skill in the art upon review of the following descriptions of specific embodiments of methods and apparatus.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
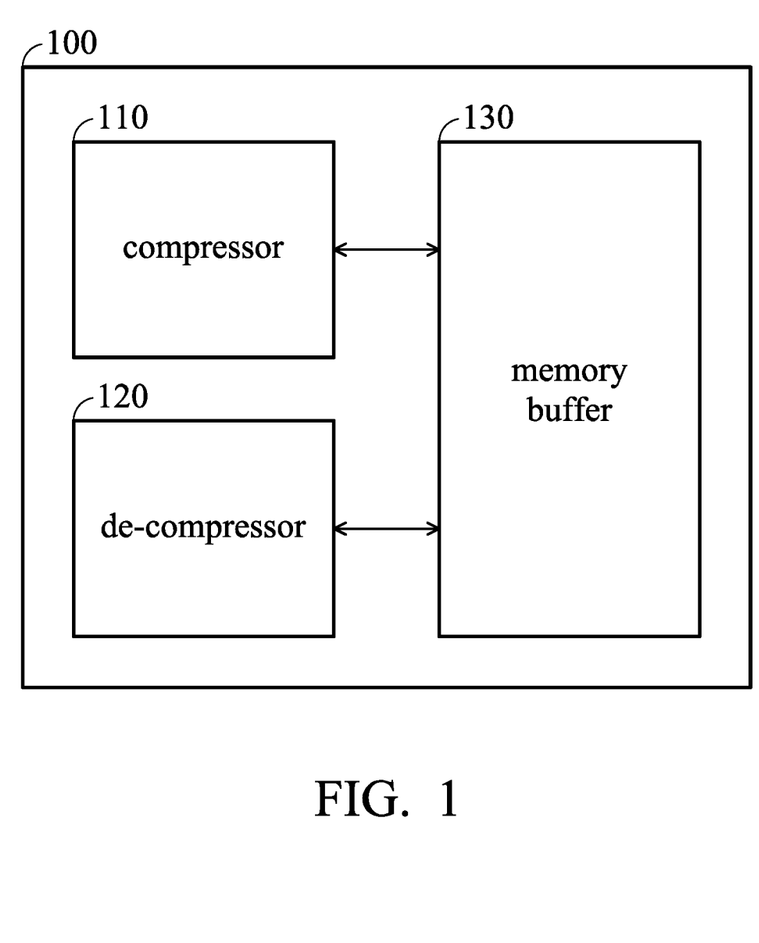
FIG. 1 is a block diagram of an electronic apparatus 100 according to an embodiment of the invention.

FIG. 1 is a block diagram of an electronic apparatus 100 according to an embodiment of the invention. The electronic apparatus 100 may be a mobile phone, a smartphone, a tablet computer, a notebook, a personal digital assistant (PDA) and so on. As shown in FIG. 1, the electronic apparatus 100 comprises a compressor 110, a de-compressor 120, and a memory buffer 130. FIG. 1 presents a simplified block diagram in which only the elements relevant to the invention are shown. However, the invention should not be limited to what is shown in FIG. 1.

In an embodiment of the invention, the memory buffer 130 is configured to store the data and signals. In an embodiment of the invention, the memory buffer 130 also can comprise in the compressor 110 and de-compressor 120.

Figure 2:
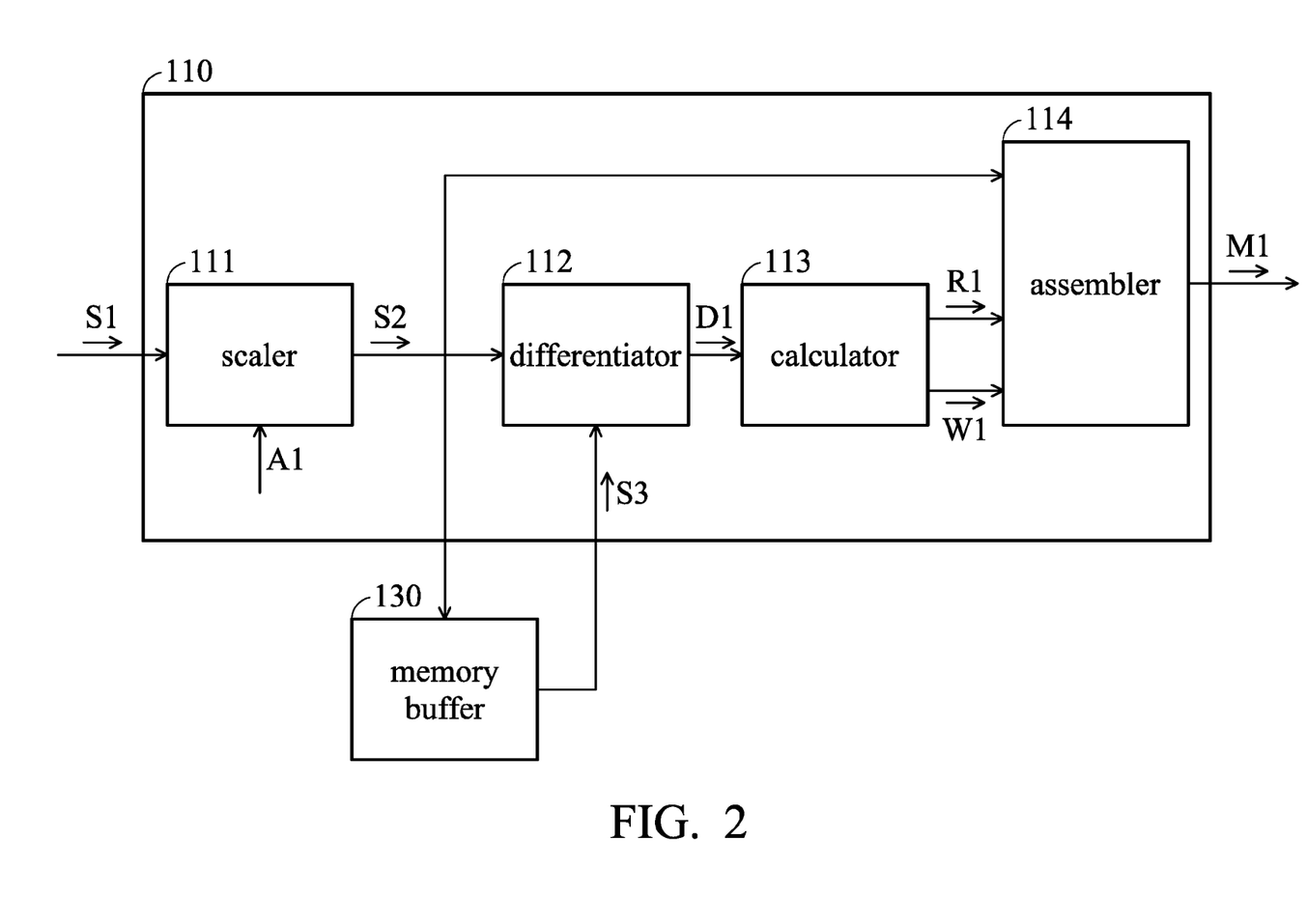
FIG. 2 is a block diagram of the compressor 110 according to an embodiment of the invention.

FIG. 2 is a block diagram of the compressor 110 according to an embodiment of the invention. As shown in FIG. 2, the compressor 110 comprises a scaler 111, a differentiator 112, a calculator 113, and assembler 114. FIG. 2 presents a simplified block diagram in which only the elements relevant to the invention are shown. However, the invention should not be limited to what is shown in FIG. 2. In an embodiment of the invention, before the electronic apparatus 100 transmits a signal (e.g. OFDM signal), the electronic apparatus 100 may compress the OFDM signal by the compressor 110.

As shown in FIG. 2, when the compressor 110 receives the input OFDM signal S1, the scaler 111 will scale the input OFDM signal S1 by a adjust signal A1. In an embodiment of the invention, the scaler 111 may be a divider, and the divider may scale the magnitude of the input OFDM signal S1 by dividing the magnitude of the input OFDM signal S1 by a parameter (i.e. adjust signal).

In an embodiment of the invention, after scaling the input OFDM signal S1, the scaler 111 will generate a scaled signal S2, and transmit the scaled signal S2 to the differentiator 112, the assembler 114 and the memory buffer 130. When the differentiator 112 receives the scaled signal S2, the differentiator 112 will computed the difference between the scaled signal S2 and a prior signal S3 stored in the memory buffer 130 to generate a differentiation signal D1. Then, the differentiator 112 may transmit the differentiation signal D1 to the calculator 113.

Figure 3:
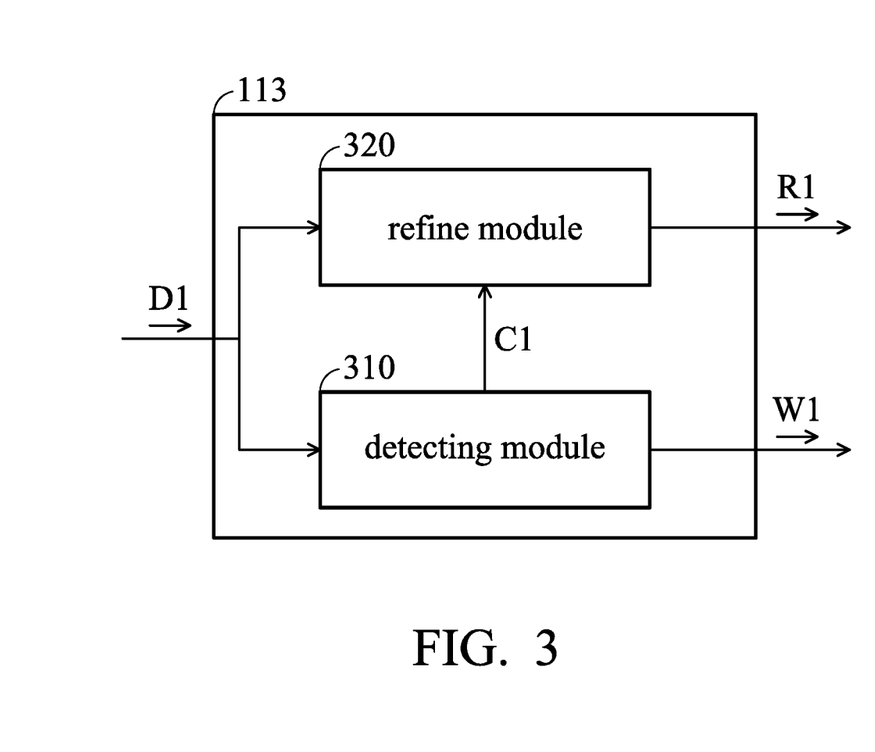
FIG. 3 is a block diagram of the calculator 113 according to an embodiment of the invention.

FIG. 3 is a block diagram of the calculator 113 according to an embodiment of the invention. As shown in FIG. 3, the calculator 113 comprises a detecting module 310 (or a detecting circuit) and a refine module 320 (or a refine circuit). FIG. 3 presents a simplified block diagram in which only the elements relevant to the invention are shown. However, the invention should not be limited to what is shown in FIG. 3.

When the calculator 113 receives the differentiation signal D1 from differentiator 112, the detecting module 310 will detect the zero bits of the differentiation signal D1 to generate a zero range control signal C1, i.e. the detecting module 310 will detect how many zero bits in the differentiation signal D1 to generate a zero range control signal C1. Then, the detecting module 310 may transmit the zero range control signal C1 to the refine module 320. When the refine module 320 receives the zero range control signal C1 from the detecting module 310, the refine module 320 will refine the differentiation signal D1 according to zero range control signal C1. That is to say the refine module 320 will remove the zero bits of the differentiation signal D1 according to the zero range control signal C1 to compress the differentiation signal D1 and generate a refined signal R1. For example, if the zero range control signal C1 indicates that the differentiation signal D1 comprises five zero bits, the refine module 320 will remove the five zero bits of the differentiation signal D1 to generate a refined signal R1. If the size of the differentiation signal D1 is 16 bits, after refining the differentiation signal D1, the size of the refined signal R1 will become 11 bits. After generating the refined signal R1, the refine module 320 may transmit the refined signal R1 to the assembler 114.

In addition, the detecting module 310 may generate zero range control word W1 according to the number of zero bits of the differentiation signal D1, and then transmit the zero range control word W1 to the assembler 114. For example, if the differentiation signal D1 comprises three zero bits, the detecting module 310 may convert or compress the three zero bits of the differentiation signal D1 to generate one zero range control word, and if the differentiation signal D1 comprises five zero bits, the detecting module 310 may convert or compress the five zero bits of the differentiation signal D1 to generate another zero range control word. In an embodiment of the invention, the zero range control word W1 may set by one bit (e.g. 1 or 0) or two bits (e.g. 11, 01, 10, 00), wherein different zero range control words may correspond to different numbers of the zero bits which has been removed from the differentiation signal.

In an embodiment of the invention, the zero range control word W1 is set according to one or more thresholds, wherein the threshold is set according to the statistical property of the signal (e.g. the distribution of the signal). For example, if a threshold is set, the detecting module 310 may determine whether the statistical property of the differentiation signal D1 is larger than the threshold. When the statistical property of the differentiation signal D1 is larger than the threshold, the zero range control word W1 will be set to first value (e.g. 1); and when the statistical property of the differentiation signal D1 is smaller than the thresholds, the zero range control word W1 will be set to second value (e.g. 0).

In an embodiment of the invention, the assembler 114 may determine to combine the zero range control word W1 with the scaled signal S2 or combine the zero range control word W1 with the refined signal R1 according to the zero range control word W1 to generate a compressed signal M1. For example, if the assembler 114 determines that the scaled signal S2 may not comprise any zero bits according to the zero range control word W1 (i.e. the scaled signal S2 doesn't have any space which can be compressed), the assembler 114 will combine the zero range control word W1 with the scaled signal S2 to generate the compressed signal M1. If the assembler 114 determines that the scaled signal S2 may comprise one or more zero bits according to the zero range control word W1, the assembler 114 will combine the zero range control word W1 with the refined signal R1 to generate the compressed signal M1.

Figure 4:
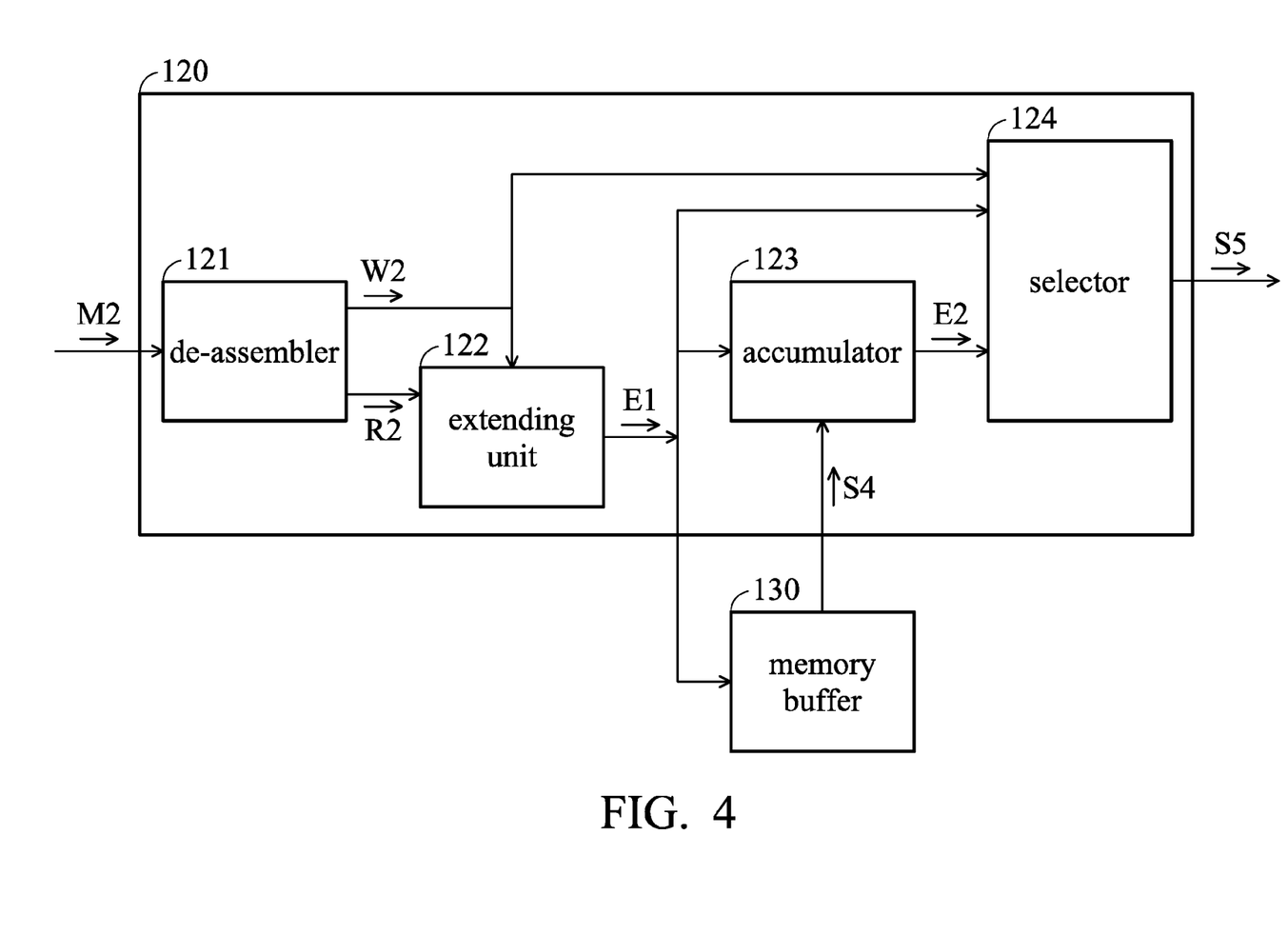
FIG. 4 is a block diagram of the de-compressor 120 according to an embodiment of the invention.

FIG. 4 is a block diagram of the de-compressor 120 according to an embodiment of the invention. As shown in FIG. 4, the de-compressor 120 comprises a de-assembler 121, an extending unit 122, an accumulator 123, and selector 124. FIG. 4 presents a simplified block diagram in which only the elements relevant to the invention are shown. However, the invention should not be limited to what is shown in FIG. 4.

As shown in FIG. 4, when the de-assembler 121 receives a compressed signal M2 (i.e. compressed OFDM signal) from other electronic device, the de-assembler 121 will de-assemble the compressed signal M2 to generate a zero range control word W2 and a refined signal R2, wherein the compressed signal M2 comprises two parts, one part corresponds to the zero range control word W2 and the other part corresponds to the refined signal R2. Then, the zero range control word W2 will be transmitted to the extending unit 122 and the selector 124, and the refined signal R2 will be transmitted to the extending unit 122.

When the extending unit 122 receives the zero range control word W2 and the refined signal R2, the extending unit 122 will determine how many zero bits need to be extended to the refined signal R2 according to the zero range control word W2 to generate first extending signal E1. For example, if the zero range control word W2 indicates the original signal of the refined signal R2 has five zero bits, the extending unit 122 will determine to extend five zero bits to the refined signal R2 to generate first extending signal E1.

After generating the first extending signal E1, the extending unit 122 may transmit the first extending signal E1 to the accumulator 123, selector 124 and the memory buffer 130. Because the first extending signal E1 may be processed by the differentiator 112 in the compression operation, the first extending signal E1 may need to be recovered by the operation of accumulator 123. When the accumulator 123 receives the first extending signal E1, the accumulator 123 will accumulate the first extending signal E1 with a prior signal S4 stored in the memory buffer 130 to generate the second extending signal E2, and then transmit the second extending signal E2 to the selector 124.

When the selector 124 receives the zero range control word W2, the first extending signal E1 and the second extending signal E2, the selector 124 will determine to select the first extending signal E1 or the second extending signal E2 as a decompressed signal S5 according to the zero range control word W2. If the zero range control word W2 indicates the first extending signal E1 does not comprise the zero bits, the selector 124 will select the first extending signal E1 as the decompressed signal S5 (i.e. the original OFDM signal). If the zero range control word W2 indicates the first extending signal E1 comprises the zero bits (i.e. the first extending signal E1 need to be recovered by the operation of the accumulator 123), the selector 124 will select the second extending signal E2 as the decompressed signal S5. In an embodiment of the invention, as the zero range control word W1, the zero range control word W2 is set according to one or more thresholds.

Figure 5:
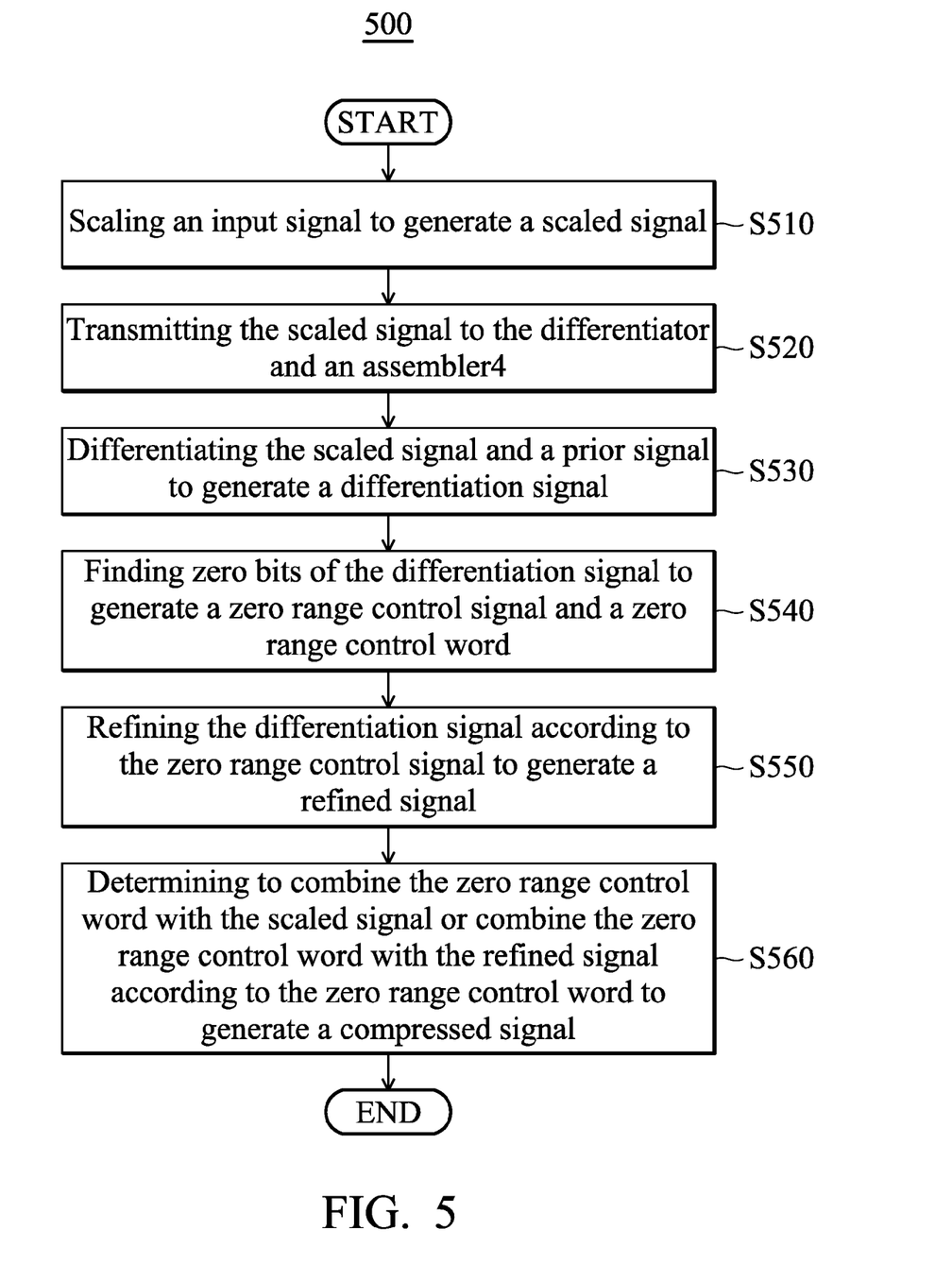
FIG. 5 is a flow chart 500 illustrating a data compression method according to an embodiment of the invention.

FIG. 5 is a flow chart 500 illustrating a data compression method according to an embodiment of the invention. The data compression method is applied to the compressor 110. First, in step S510, the compressor 110 scales an input signal to generate a scaled signal. In step S520, the scaled signal is transmitted to the differentiator 112 and an assembler 114. In step S530, the compressor 110 differentiates the scaled signal and a prior signal to generate a differentiation signal. In step S540, the compressor 110 detects zero bits of the differentiation signal to generate a zero range control signal and a zero range control word. In step S550, the compressor 110 refines the differentiation signal according to the zero range control signal to generate a refined signal, i.e. the refined signal is generated by removing the zero bits of the differentiation signal. In step S560, the compressor 110 determines to combine the zero range control word with the scaled signal or combine the zero range control word with the refined signal according to the zero range control word to generate a compressed signal.

In an embodiment of the invention, in the data compression method 500, the zero range control word is set according to the number of zero bits of the differentiation signal and one or more thresholds.

Figure 6:
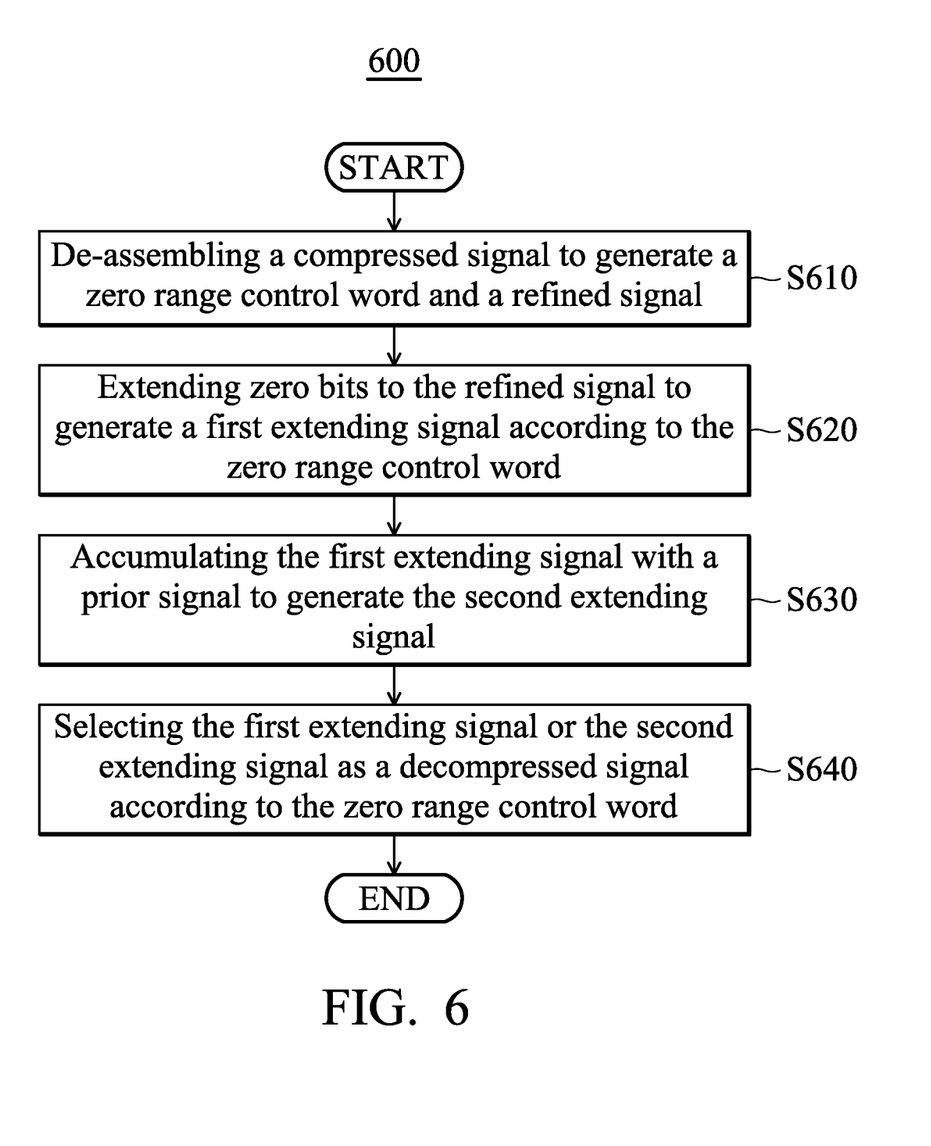
FIG. 6 is a flow chart 600 illustrating a data de-compression method according to an embodiment of the invention.

FIG. 6 is a flow chart 600 illustrating the data de-compression method according to an embodiment of the invention. The data de-compression method is applied to the de-compressor 120. In step S610, the de-compressor 120 de-assembles a compressed signal to generate a zero range control word and a refined signal. In step S620, the de-compressor 120 extends zero bits to the refined signal to generate a first extending signal according to the zero range control word. In step S630, the de-compressor 120 accumulates the first extending signal with a prior signal to generate the second extending signal. In step S640, the de-compressor 120 selects the first extending signal or the second extending signal as a decompressed signal according to the zero range control word.

In an embodiment of the invention, in the data de-compression method 600, the zero range control word is set according to one or more thresholds.

In the data compression/de-compression method of the invention, the zero bits of the OFDM signal can be converted or compressed to the zero range control word and the zero range control word is combined with the non-zero bits of the OFDM signal to generate the compressed data to decrease the data size of the transmission data and decrease the transmission throughput.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects, any suitable computer-program product may comprise a computer-readable medium comprising codes relating to one or more of the aspects of the disclosure. In some aspects, a computer software product may comprise packaging materials.

Reference throughout this specification to "one embodiment" or "an embodiment" means that a particular feature, structure, or characteristic described in connection with the embodiment is included in at least one embodiment of the invention, but does not denote that they are present in every embodiment. Thus, the appearance of the phrases "in one embodiment" or "in an embodiment" in various places throughout this specification are not necessarily referring to the same embodiment of the invention.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data compression method, comprising:
    scaling an input signal to generate a scaled signal;
    transmitting the scaled signal to a differentiator and an assembler;
    differentiating the scaled signal and a prior signal to generate a differentiation signal;
    detecting zero bits of the differentiation signal to generate a zero range control signal and a zero range control word;
    refining the differentiation signal according to the zero range control signal to generate a refined signal; and
    determining to combine the zero range control word with the scaled signal or combine the zero range control word with the refined signal according to the zero range control word to generate a compressed signal.

2. The data compression method of claim 1, wherein the zero range control signal indicates the number of zero bits of the differentiation signal.

3. The data compression method of claim 1, wherein the zero range control word is set according to the number of zero bits of the differentiation signal.

4. The data compression method of claim 3, wherein the zero range control word is set further according to one or more thresholds.

5. The data compression method of claim 1, wherein the refined signal is generated by removing the zero bits of the differentiation signal.

6. A data de-compression method, comprising:
    de-assembling a compressed signal to generate a zero range control word and a refined signal;
    extending zero bits to the refined signal to generate a first extending signal according to the zero range control word;
    selecting the first extending signal or a second extending signal as a decompressed signal according to the zero range control word, wherein the second extending signal is generated according to the first extending signal; and
    accumulating the first extending signal with a prior signal to generate the second extending signal.

7. The data de-compression method of claim 6, wherein the compressed signal comprises a first part compressed signal and a second part compressed signal.

8. The data de-compression method of claim 7, further comprising
    generating the zero range control word according to the first part compressed signal; and
    generating the refined signal according to the second part compressed signal.

9. The data de-compression method of claim 6, wherein the zero range control word is set according to one or more thresholds.

10. A data compressor, comprising:
    a scaler, configured to scale an input signal to generate a scaled signal;
    a differentiator configured to receive the scaled signal from the scaler and differentiate the scaled signal and a prior signal stored in a memory buffer to generate a differentiation signal;
    a calculator, configured to detect zero bits of the differentiation signal to generate a zero range control signal and a zero range control word and refine the differentiation signal according to the zero range control signal to generate a refined signal; and
    an assembler, configured to determine to combine the zero range control word with the scaled signal or combine the zero range control word with the refined signal according to the zero range control word to generate a compressed signal.

11. The data compressor of claim 10, wherein the zero range control signal indicates the number of zero bits of the differentiation signal.

12. The data compressor of claim 10, wherein the zero range control word is set according to the number of zero bits of the differentiation signal.

13. The data compressor of claim 12, wherein the zero range control word is set further according to one or more thresholds.

14. The data compressor of claim 10, wherein the calculator removes the zero bits of the differentiation signal to generate the refined signal.

15. The data compressor of claim 10, wherein the calculator comprises:
    a detecting module, configured to detect zero bits of the differentiation signal; and
    a refine module, configured to refine the differentiation signal according to the zero range control signal.

16. A data de-compressor, comprising:
    a de-assembler, configured to de-assemble a compressed signal to generate a zero range control word and a refined signal;
    an extending unit, configured to receive the zero range control word and the refined signal from the de-assembler and extend zero bits to the refined signal to generate a first extending signal according to the zero range control word;
    a selector, configured to select the first extending signal or a second extending signal as a decompressed signal according to the zero range control word, wherein the second extending signal is generated according to the first extending signal; and
    an accumulator, configured to accumulate the first extending signal with a prior signal stored in a memory buffer to generate the second extending signal.

17. The data de-compressor of claim 16, wherein the compressed signal comprises a first part compressed signal and a second part compressed signal.

18. The data de-compressor of claim 17, wherein the de-assembler generates the zero range control word according to the first part compressed signal, and generates the refined signal according to the second part compressed signal.

19. The data de-compressor of claim 16, wherein the zero range control word is set according to one or more thresholds.

* * * * *